US011844279B2

(12) United States Patent
Yogeswaren et al.

(10) Patent No.: US 11,844,279 B2
(45) Date of Patent: Dec. 12, 2023

(54) ADDITIVE MANUFACTURING APPARATUS FOR MANUFACTURING PIEZOELECTRIC INSTRUMENTATION DEVICES WITH 3D STRUCTURES

(71) Applicants: Elan Yogeswaren, Houston, TX (US); Navin Sakthivel, Spring, TX (US); Otto Fanini, Houston, TX (US)

(72) Inventors: Elan Yogeswaren, Houston, TX (US); Navin Sakthivel, Spring, TX (US); Otto Fanini, Houston, TX (US)

(73) Assignee: BAKER HUGHES OILFIELD OPERATIONS LLC, Houston, TX (US)

( * ) Notice: Subject to any disclaimer, the term of this patent is extended or adjusted under 35 U.S.C. 154(b) by 0 days.

(21) Appl. No.: 17/846,573

(22) Filed: Jun. 22, 2022

(65) Prior Publication Data

US 2022/0328754 A1 Oct. 13, 2022

Related U.S. Application Data

(62) Division of application No. 17/015,884, filed on Sep. 9, 2020, now Pat. No. 11,545,615.

(51) Int. Cl.
*H10N 30/045* (2023.01)
*H10N 30/053* (2023.01)
*H10N 30/30* (2023.01)

(52) U.S. Cl.
CPC ......... *H10N 30/045* (2023.02); *H10N 30/053* (2023.02); *H10N 30/302* (2023.02)

(58) Field of Classification Search
CPC .. H10N 30/045; H10N 30/053; H10N 30/302; H01L 41/257; H01L 41/273; H01L 41/1132
See application file for complete search history.

(56) References Cited

U.S. PATENT DOCUMENTS 6,063,194 A * 5/2000 Poliniak ............... B65B 1/30
118/623
7,513,147 B2 4/2009 Yogeswaren
(Continued)

FOREIGN PATENT DOCUMENTS

CA 3043345 A1 * 5/2018 ........... B29C 64/106
CN 104197714 A 12/2014
(Continued)

OTHER PUBLICATIONS

Notification of Transmittal of the International Search Report and the Written Opinion; PCT/US2021/049360; Korean Intellectual Property Office; dated Dec. 20, 2021; 10 pages.

*Primary Examiner* — Jeffrey T Carley
(74) *Attorney, Agent, or Firm* — CANTOR COLBURN LLP

(57) ABSTRACT

An apparatus for fabricating a piezoelectric transducer includes a base and a piezoelectric powder depositor to traverse the base and deposit a plurality of layers of piezoelectric powder on the base. The apparatus also includes an electrode disposed at an end of a boom of which is moveable to a selected location with respect to the base and a voltage source to apply a voltage to the electrode to establish an electric field between the electrode and base with sufficient strength to sinter and pole each layer of piezoelectric material and a controller having instructions to deposit the plurality of layers of the piezoelectric powder on the base and to control a position of the electrode and actuate the voltage source to the electrode to sinter and pole the layer of piezoelectric material at defined locations after each layer is deposited to form the piezoelectric transducer in a selected shape.

6 Claims, 5 Drawing Sheets

(56) References Cited

U.S. PATENT DOCUMENTS

| | | | |
|---|---|---|---|
| 9,431,041 B1* | 8/2016 | Schreiber | G11B 5/4833 |
| 9,862,606 B1 | 1/2018 | Cook et al. | |
| 10,128,431 B1 | 11/2018 | Dunn et al. | |
| 10,860,101 B1 | 12/2020 | Menguc et al. | |
| 2003/0032214 A1* | 2/2003 | Huang | B29C 64/112 |
| | | | 264/435 |
| 2003/0070271 A1* | 4/2003 | Yasugi | H03H 3/02 |
| | | | 29/25.35 |
| 2003/0178914 A1* | 9/2003 | Ogawa | H10N 30/045 |
| | | | 310/311 |
| 2004/0134049 A1* | 7/2004 | Schreiner | H10N 30/883 |
| | | | 29/25.35 |
| 2004/0151978 A1* | 8/2004 | Huang | B82Y 25/00 |
| | | | 427/256 |
| 2006/0205097 A1 | 9/2006 | Kadotani et al. | |
| 2010/0227521 A1 | 9/2010 | Whinnery | |
| 2012/0163130 A1* | 6/2012 | Gloo | H10N 30/088 |
| | | | 29/25.35 |
| 2014/0184878 A1 | 7/2014 | Watanabe et al. | |
| 2016/0016369 A1* | 1/2016 | Tarbutton | B29C 64/106 |
| | | | 264/435 |
| 2017/0368574 A1 | 12/2017 | Sammoura et al. | |
| 2018/0370237 A1* | 12/2018 | Mizukami | B41J 2/14233 |
| 2019/0044055 A1* | 2/2019 | Kondo | H10N 30/097 |
| 2019/0054659 A1* | 2/2019 | Tseng | B33Y 70/10 |
| 2019/0255767 A1 | 8/2019 | Hayes et al. | |
| 2019/0311980 A1 | 10/2019 | Eid et al. | |
| 2020/0243748 A1 | 7/2020 | Hirose et al. | |
| 2021/0008932 A1 | 1/2021 | Stowell et al. | |
| 2021/0328130 A1* | 10/2021 | Wang | B33Y 10/00 |
| 2022/0077380 A1 | 3/2022 | Yogeswaren et al. | |
| 2022/0254985 A1* | 8/2022 | Wang | H10N 30/857 |

FOREIGN PATENT DOCUMENTS

| | | | |
|---|---|---|---|
| EP | 2846159 A1 | 3/2015 | |
| KR | 20180105116 A | 9/2018 | |
| WO | WO-2020083833 A1 * | 4/2020 | H01L 41/257 |
| WO | 2020089211 A1 | 5/2020 | |

\* cited by examiner

ADDITIVE MANUFACTURING APPARATUS FOR MANUFACTURING PIEZOELECTRIC INSTRUMENTATION DEVICES WITH 3D STRUCTURES

CROSS REFERENCE TO RELATED APPLICATION

This application is a divisional of U.S. application Ser. No. 17/015,884 filed Sep. 9, 2020, the disclosure of which is incorporated by reference herein in its entirety.

BACKGROUND

Acoustic sensors and fluid sensors may be used in boreholes or wellbores drilled into geologic subsurface formations for various applications such as in the hydrocarbon recovery industry. For example, acoustic sensors may be used to characterize downhole tubulars and their bonding, while fluid sensors may be used measure properties of downhole fluids such as viscosity. Enhanced performance and sensitivity of these devices are needed to improve their usefulness. Unfortunately, diamond cutting and other manufacturing techniques in the prior art can limit the final performance of these devices. For example, laser and optical micro-machining can leave many micro-cracks and micro-fractures in a sensor compromising its reliability and performance. In addition, a sensor may need to have a complex piezocomposite configuration or shape and may need mechanical features for mounting purposes and these configurations and mechanical features can be difficult to achieve with conventional manufacturing methods. Hence, it would be well received by the hydrocarbon production industry if new manufacturing techniques were developed to fabricate acoustic transducers and fluid sensors that have improved performance and sensitivity.

BRIEF SUMMARY

Disclosed is a method for fabricating a piezoelectric transducer. The method includes: depositing a layer of a piezoelectric material on a base using a depositor; and applying an electric field to the layer of deposited piezoelectric material in defined locations using an electrode to sinter and pole the deposited piezoelectric material at those defined locations to form a layer of the piezoelectric transducer in a selected shape and with a selected dipole direction.

Also disclosed is an apparatus for fabricating a piezoelectric transducer. The apparatus includes: a base; a piezoelectric powder depositor configured to deposit a layer of piezoelectric powder on the base; a gantry and boom assembly configured to move an end of the boom to a selected location with respect to the base; an electrode disposed at the end of the boom; a voltage source coupled to the electrode and base and configured to apply a voltage to the electrode with respect to the base to establish an electric field between the electrode and base with sufficient strength to sinter and pole the layer of piezoelectric material; and a controller coupled to the gantry and boom assembly and the voltage source and configured to control a position of the electrode and actuate the voltage source to the electrode to sinter and pole the layer of piezoelectric material at defined locations to form a layer of the piezoelectric transducer in a selected shape.

Further disclosed is an acoustic transducer having a plurality of layers of a piezoelectric material disposed one layer upon another layer, the plurality of layers having a selected shape, thickness, and dipole direction.

BRIEF DESCRIPTION OF THE DRAWINGS

The following descriptions should not be considered limiting in any way. With reference to the accompanying drawings, like elements are numbered alike.

DETAILED DESCRIPTION

A detailed description of one or more embodiments of the disclosed apparatus and method presented herein by way of exemplification and not limitation with reference to the figures.

Disclosed are methods and apparatuses for fabricating a piezoelectric transducer for an acoustic sensor or fluid sensor using novel additive manufacturing techniques. In one or more embodiments, the piezoelectric transducer is configured to be disposed in a borehole penetrating a subsurface formation. In downhole applications, the piezoelectric transducer may be configured for sensing a fluid property such as viscosity and/or acting as an acoustic sensor to transmit and/or receive acoustic waves for measuring structural properties such as a thickness of a tubular or casing or a quality of a bond for the tubing or casing. The piezoelectric transducer may also be used in other types of applications where an optimal piezocomposite configuration or shape will have optimal transmission and reception properties.

A novel additive manufacturing apparatus is configured to lay down a layer of a piezoelectric material in powder form on a surface and then apply a very high electric field to defined locations in an X-Y plane using an electrode to sinter and pole the material a those defined locations. Hence, based on those defined locations the piezoelectric material forms a defined shape in the deposited layer. Once one layer is deposited, sintered, and poled, then another layer can be deposited on top of the previous layer and also sintered and poled at defined locations. In this way, a piezoelectric transducer having a precisely defined shape and precisely defined poling direction can be fabricated. In that the piezoelectric transducer may be used in a borehole penetrating a subsurface formation, space for housing that transducer is constrained or very limited. Thus, the disclosed additive manufacturing techniques provide the advantage of being able to precisely fabricate the transducer with small enough dimensions to fit in the borehole without relying on diamond cutting or much handcrafting. Consequently, these piezoelectric transducers can be fabricated more precisely and economically compared to prior art piezoelectric transducers especially in applications requiring curved structures with piezocomposite configurations. One advantage of more precise fabrication is an increase in accuracy and precision of measurements performed by the transducers in addition to increased reliability of the transducers.

Figure 1:
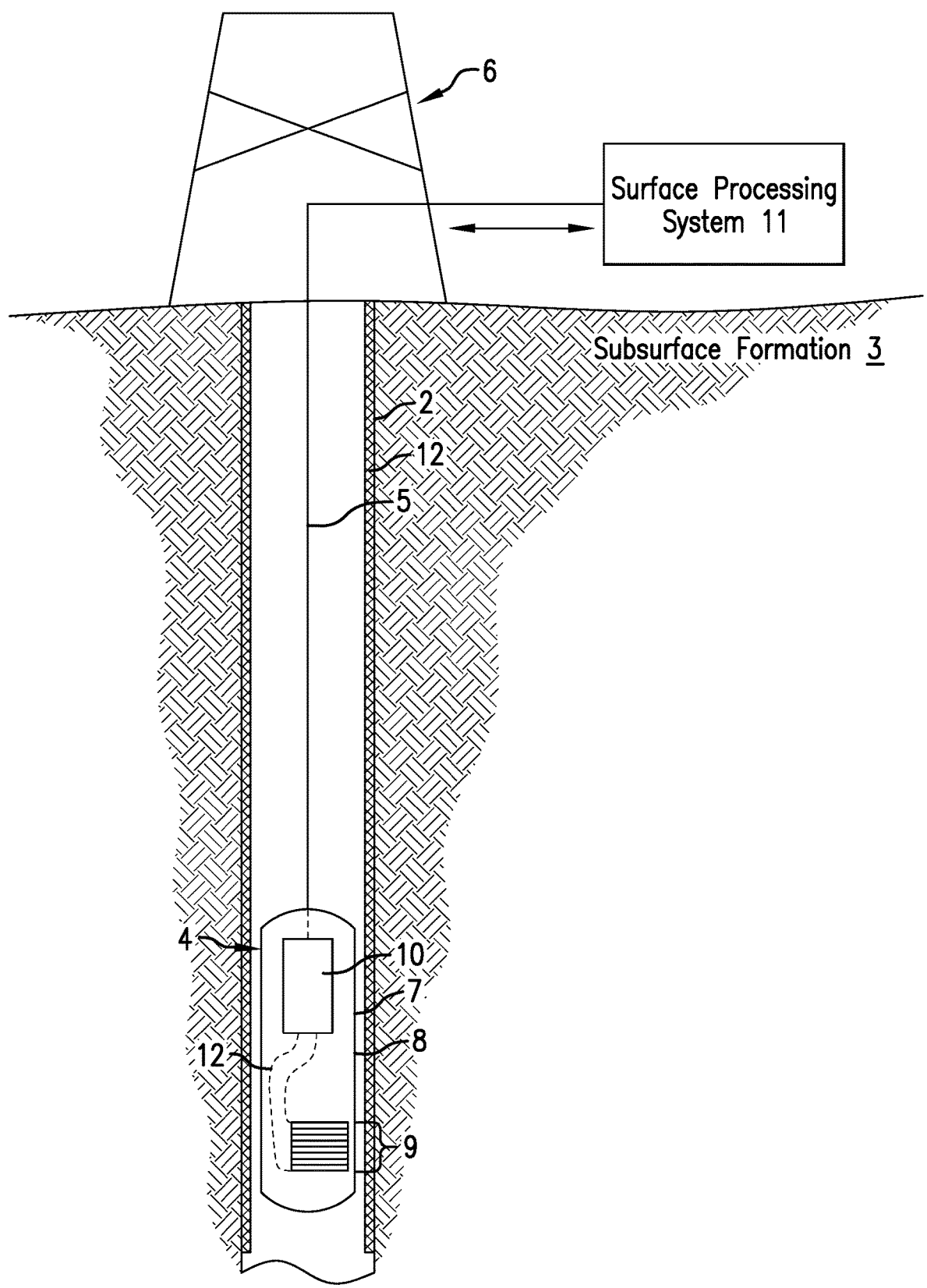
FIG. 1 is a cross-sectional view of an embodiment of an acoustic tool having a piezoelectric transducer disposed in a borehole penetrating a subsurface formation.

FIG. 1 illustrates a cross-sectional view of a borehole 2 penetrating a subsurface formation 3. An acoustic tool 4 is configured to be conveyed through the borehole 2 by a carrier 5. A tubular 12 such as a casing may be disposed in the borehole 2 as part of a completion. In one or more embodiments, the carrier 5 is an armored wireline in an embodiment referred to as wireline logging. Alternatively, the carrier 5 can be a tubular string such as a drill string. The carrier 5 is operated by surface equipment 6 such as a winch for wireline logging or a topside rig for operation of the tubular string. A piezoelectric transducer 9 is disposed on the acoustic tool 4 for performing acoustic fluid or structural measurements. The piezoelectric transducer 9 is illustrated with multiple layers of piezoelectric material in accordance with disclosure discussed below. For protection, the piezoelectric transducer 9 may be disposed in a sub 7 or housing 8. Downhole electronics 10 may be configured to operate the piezoelectric transducer 9 and/or the acoustic tool 4 such as for sampling operations and/or acting as a telemetry interface for transmitting sensed or processed data to a surface processing system 11 and/or receiving signals from the surface. Leads 12 may electrically connect the piezoelectric transducer 9 to the downhole electronics 10. Processing or operation functions may be performed by the downhole electronics 10, the surface processing system 11, or a combination thereof.

In one or more embodiments, a fluid property may be measured by withdrawing a sample of a formation fluid into the acoustic tool 4 and immersing the piezoelectric transducer 9 or a portion of the piezoelectric transducer 9 into the fluid sample. Then the piezoelectric transducer 9 is operated at various frequencies to determine an acoustic impedance of the fluid sample, which can be related to the fluid property as known in the art.

In one or more embodiments, a downhole structural property may be sensed by transmitting an acoustic signal at a selected frequency toward a structure of interest and receiving a return acoustic signal due to interactions of the transmitted acoustic signal with the structure of interest. The return acoustic signal may then be processed using processing techniques known in the art to determine the structural property.

Figure 2:
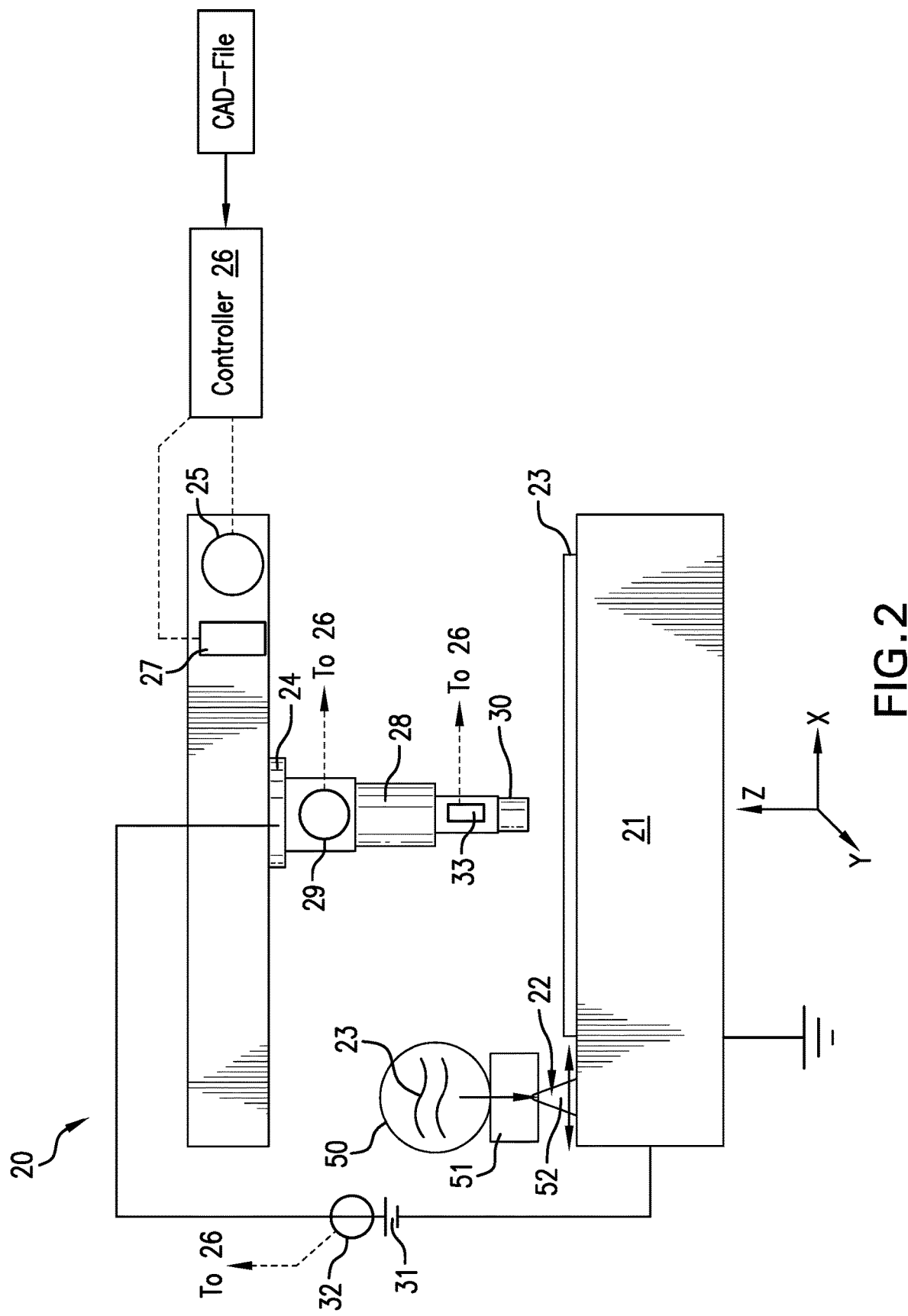
FIG. 2 is a cross-sectional view of an additive manufacturing apparatus for fabricating the piezoelectric transducer.

FIG. 2 is a cross-sectional view of an additive manufacturing apparatus (AMA) 20 configured for fabricating the piezoelectric transducer 9. The AMA 20 includes a base 21 that is conductive and grounded. The AMA 20 also includes a powder depositor 22 that is configured to deposit a layer or multiple layers of material 23 in powder form upon the conductive base. The powder depositor 22 may also be referred to as a powder deposition recoater for depositing multiple layers by traversing the base 21 in a back and forth motion. The material 23 can be any material selected to be incorporated into the piezoelectric transducer 9. In one or more embodiments, the material 23 is a piezoelectric material such as lead zirconate titanate, modified lead zirconate titanate, barium titanate, and/or quartz in non-limiting examples. Other piezoelectric materials may also be used. In one or more embodiments, the material 23 can be a conductive material for forming conductive leads for applying or sensing a voltage to or from the piezoelectric transducer 9.

In one or more embodiments, the powder depositor 22 is configured to traverse the base 21 to deposit a layer such that each traverse will deposit one layer. Accordingly, a motor (not shown) may provide the motive force to move the powder depositor 22. The powder depositor 22 may include a reservoir 50 for containing a reservoir of the material 23 in powder form. A powder injector 51 may be coupled to the reservoir 50 and configured for injecting the material 23 to a spreader 52. The powder injector 51 may use a compressed gas or a mechanical pump or material mover for the injecting. The spreader 52 may have a fixed or adjustable opening for spreading the material 23 in a layer. The thickness of the layer can be selected based upon the speed of the spreader 52 as it traverses the base 21 and the flow rate of the material 23 in powder form. In turn, the flow rate may be dependent on the opening in the spreader 52.

The AMA 20 includes a gantry 24 that is configured to move at least in an X-Y plane with respect to the base 21 so that a selected point of the gantry 24 can be positioned over a corresponding selected point on the base 21. To apply a force for movement, the gantry 24 includes a gantry motor or actuator 25 that is controlled by a controller 26. In one or more embodiments, the gantry motor 25 is a stepper motor as known in the art. The AMA 20 also includes a position sensor 27 configured to sense a position of the gantry 24 relative to the base 21 and provide a position signal to controller 26. Thus, the controller 26 can position the gantry 24 to print a layer of the piezoelectric transducer 9 with a selected shape in accordance with a CAD-file.

The AMA 20 further includes a boom 28 coupled to the gantry 24 and configured to be raised or lowered in a Z-axis direction with respect to the base 21. To apply a force for movement, the boom 28 includes a boom motor or actuator 29 that is controlled by the controller 26. In one or more embodiments, the boom motor 29 is a stepper motor as known in the art. In one or more embodiments the boom 28 includes a mechanical linkage for provide telescopic movement of the boom 28 similar to the mechanical linkage in a power zoom telescopic camera lens. Other types of movement and corresponding mechanical linkage may also be used.

Coupled to a lower end of the boom 28 is an electrode 30. The electrode 30 is configured to apply a voltage with respect to the base 21 thus generating an electric field through the layer of material 23 disposed on the base 21. The electric field has sufficient strength to conduct an electrical current through a small portion or area of the layer of material 23 thus sintering the material 23 at the small area or target zone where the current flows through. The sintering forms a solid mass of the material 23 at the areas where the material 23 was sintered. Thus, by controlling the areas being sintered a selected shape of the material 23 in solid form for the present layer can be created. The voltage for generating the electric field is provided by a voltage source 31 coupled to the electrode 30 and the base 21. In one or more embodiments, the voltage source 31 provides a voltage in a range of 5 to 10 volts DC to generate a very high electric field that conducts 10,0000 amperes of current.

In addition to sintering the material 23, the electric field also poles the material 23 when the material 23 is a piezoelectric material. Piezoelectric material in natural or powdered form has microscopic electric dipoles which have random orientation rendering the overall polarization of the material zero. When stressing this material in the natural form with a mechanical force, it will result in a very small polarization and hence weak piezoelectric effect. In order to make the material much more piezoelectric sensitive the dipoles have to be oriented in the direction of the applied forces. This process of forcing the dipoles to orient themselves in a prescribed direction is called poling. Poling is implemented by applying a very strong electric field in the intended direction for a sufficient time. After the removal of the electric field, most of the dipoles remains in their initial orientation aligned with the electric field. In one or more embodiments, the time of electric field pulsing will be a process parameter that can vary from micro-seconds to few seconds per pulse at one given point spot depending on various factors such as type of layer material, thickness of the layer, and strength of the electric field.

To ensure that a correct strength of the electric field is applied, the voltage source 31 may include a current sensor 32 that provides a current measurement to the controller 26 so that that the controller 26 can move the electrode 30 close enough to the layer of material 23 to provide a selected value of current sufficient for sintering and poling. In addition, the boom 28 may include a distance sensor 33 configured to sense a distance from the electrode 30 to the layer of material 23 and provide a distance measurement to the controller 26 in order for the controller to maintain the proper distance for maintaining the strength of the electric field sufficient for the sintering and the poling.

It can be appreciated that the electric field and thus the electric current may be applied in an inert atmosphere having an inert gas such as nitrogen in a non-limiting embodiment in order to prevent combustion of any material exposed to the electric current. The inert atmosphere may be contained in a chamber (not shown) and thus the AMA 20 may be disposed in that chamber. Alternatively, the inert gas may be injected into and around the electric field. In one or more embodiments, the inert gas may be injected into and around the electric field from around the electrode 30 similar to an inert gas welding torch.

Figure 3:
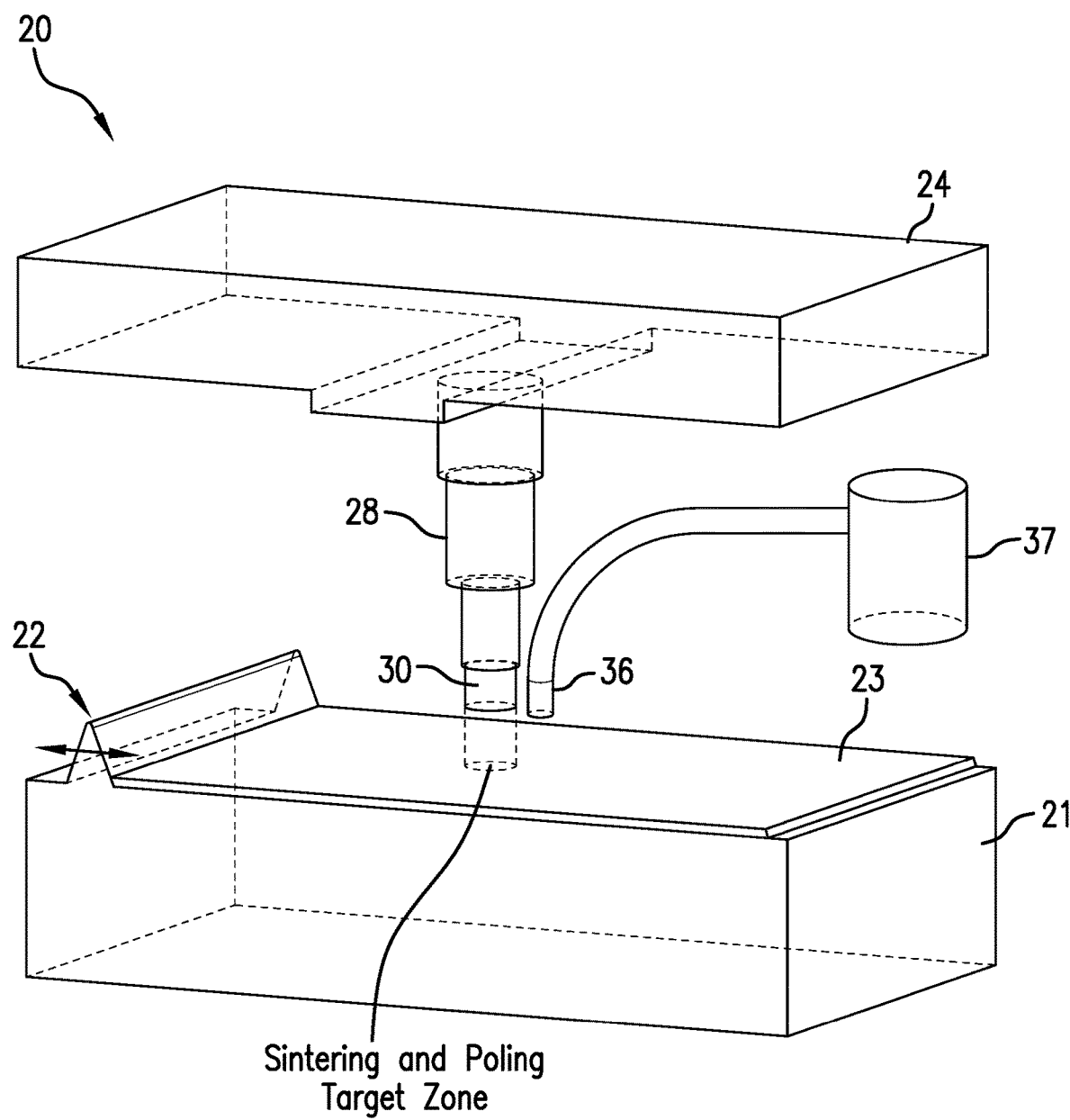
FIG. 3 is a perspective view of the additive manufacturing apparatus.

FIG. 3 illustrates a perspective view of the AMA 20 with some components. In the embodiment of FIG. 3, the AMA 20 includes a nozzle 36 disposed near the electrode 30 and coupled to an inert gas source 37. The nozzle 36 is configured to inject an inert gas into and around the electric field and/or current established by the electrode 30.

Figure 4:
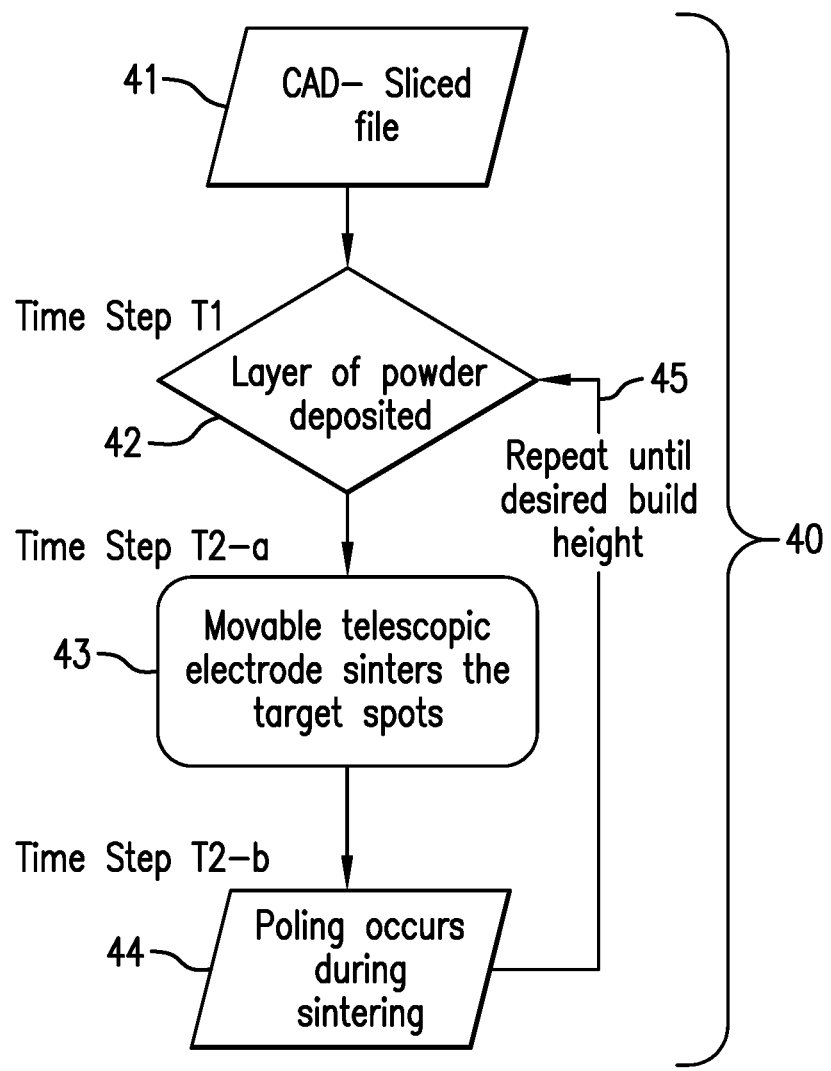
FIG. 4 is a flow chart for a method for fabricating the piezoelectric transducer.

FIG. 4 is a flow chart for a method 40 for fabricating a piezoelectric transducer. Block 41 calls for inputting a computer file such as a computer-aided-design (CAD) file providing a height and shape for each slice making up the piezoelectric transducer. The CAD file may be input to the controller 26, which can include a computer processing system having such components as a processor, memory, input interface, and output interface in non-limiting embodiments. In general, the CAD file is sliced into a machine file that identifies the zones of material consolidation needed in each discrete layer of deposition. For example, if 50 µm of powder material is to be deposited, the machine file will slice a part such as a 10 inch part into distinct layers of 50 µm. The machine readable file will distinguish the zones where piezo ceramic is present in each layer. This information will be used to help in locating the movable electrode followed by sintering and poling specifically at the zones needed to be consolidated as solid in each layer.

Block 42 calls for depositing a layer of material in powder form such as a piezoelectric material using a depositor. Other types of materials may also be deposited for fabricating the piezoelectric transducer such as a conductive material for fabricating electrical leads. In one or more embodiments, the piezoelectric powder of −100 mesh size is loaded into a powder deposition recoater at time step 0. The powder is spread across the base build platform using the recoater at time step 1.

Block 43 calls for sintering target spots using a moveable electrode. The electrode is moved to a target position as dictated by the sliced CAD file, which identifies the specific target zones that needs to be sintered or consolidated to make the part at time step 2a. The gantry and retractable telescopic positioning system is used to locate the electrode at the target spots or zones and the high electric current will flow between the electrode and the grounded base completing the circuit.

Block 44 calls for poling the target zones while they are being sintered. That is, the target zones are electrically poled at the same time that the same target zones are being sintered at time step 2b.

Block 45 calls for repeating or iterating the depositing, sintering, and poling until a desired build height and shape are obtained for the piezoelectric transducer. In addition, a selected dipole direction is also obtained. By having a desired or selected height, shape and dipole direction, the piezoelectric transducer can be optimized for a selected application such as an acoustic transducer or fluid sensor. For example, the piezoelectric transducer for a fluid sensor may have an end, such as an expanded end, with a shape configured for interacting with a fluid of interest. In another example, the piezoelectric transducer for use as an acoustic transducer may have an end with a shape, such as a concave shape, configured to concentrate acoustic waves in a narrow beam with a defined direction.

In that the piezoelectric transducer may be used in downhole applications, the method 40 may include securing the piezoelectric transducer to a housing or sub using a mechanical feature or fastener fabricated into the piezoelectric transducer such as a hole, slot, or clip in non-limiting examples. In general, the housing or sub is made of a material, such as a steel, that is compatible with the downhole environment.

Figure 5:
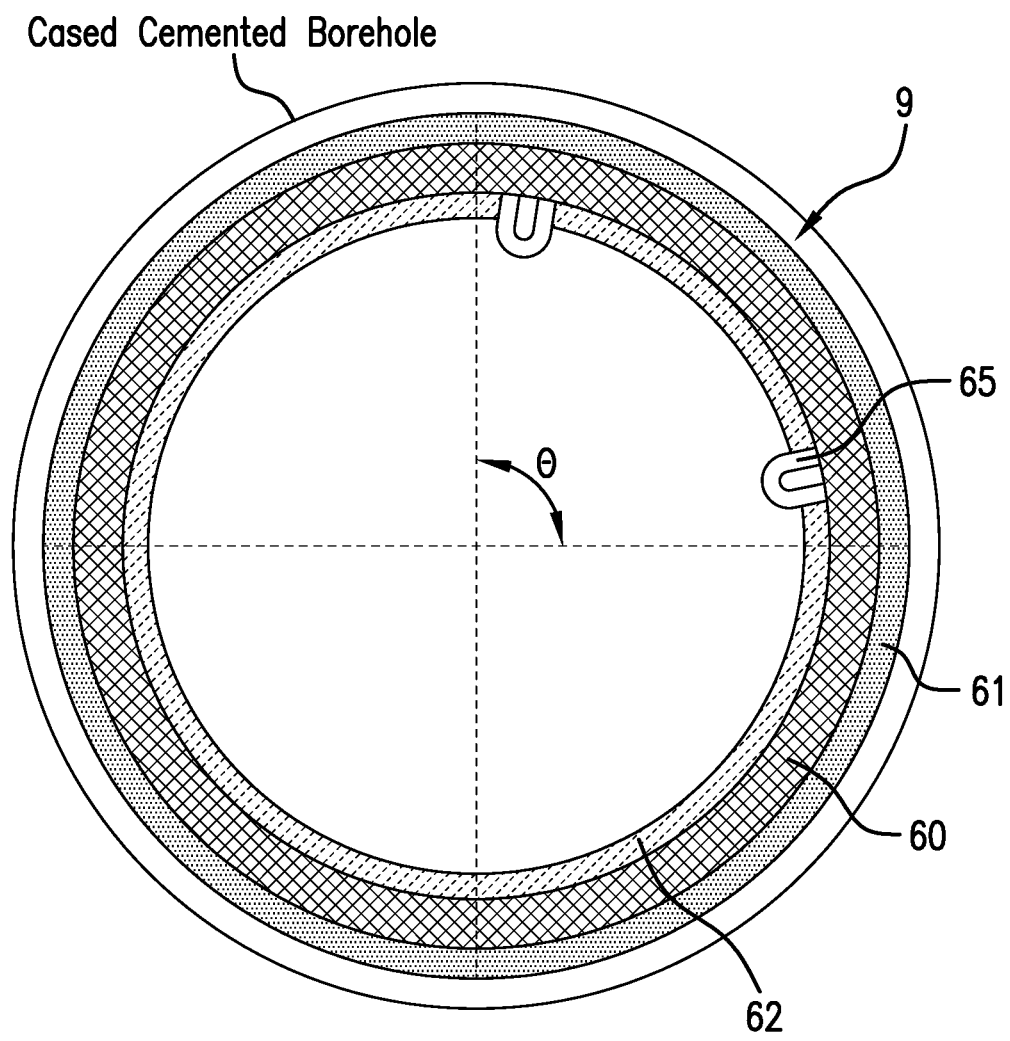
FIG. 5 depicts aspects of an embodiment of the piezoelectric transducer fabricated by the disclosed additive manufacturing apparatus.

FIG. 5 depicts aspects of an embodiment of the piezoelectric transducer 9 in a top view in which the piezoelectric transducer 9 includes layers of piezoelectric material 60. In the embodiment of FIG. 5, at least a portion of layers of piezoelectric material 60 form a mechanical fastener 65 such as a clip or that defines an opening through which a threaded fastener can be inserted to attach the piezoelectric transducer 9 to the housing 8 of the acoustic tool 4. Accordingly, the mechanical fastener 65 is fabricated in accordance with the method 40 discussed above. An acoustic impedance matching layer 61 is disposed on the layers of piezoelectric material 60 facing the borehole wall. The layer 61 matches the impedance of the layers of piezoelectric material 60 to fluid in the borehole 2 to increase transmission of acoustic energy and sensitivity of received acoustic energy. In one or more embodiments, the layer 61 has the same acoustic impedance as the piezoelectric transducer 9 at the end contacting the piezoelectric transducer 9 and the same acoustic impedance at the opposing end contacting the borehole fluid. In addition to matching impedance, the layer 61 may also provide protection against wear in the borehole 2. Non-limiting embodiments of the acoustic impedance matching layer 61 include titanium and ceramic material. The layer 61 may be attached to the layers of piezoelectric material 60 by an adhesive in a non-limiting embodiment. An acoustic attenuation layer 62 is disposed on the inside surface of the layers of piezoelectric material 60 to attenuate or prevent transmission of acoustic energy to the inside of the acoustic tool 4. Non-limiting embodiments of the acoustic attenuation layer 62 include tungsten loaded rubber. The acoustic attenuation layer 62 may be attached to the layers of piezoelectric material 60 by an adhesive in a non-limiting embodiment. The piezoelectric transducer 9 may be fabricated is curved sectors to provide a 360° field of coverage. For example, if each sector angle θ is 90°, then four sectors may be combined to provide the 360° field of coverage. The piezoelectric transducer 9 is curved in the embodiment of FIG. 5. It can be appreciated that various types of curved surfaces can be fabricated, such as changing radius curves, S-shaped, and compound curves for example, using the method 40.

In support of the teachings herein, various analysis components may be used, including a digital and/or an analog system. For example, the controller 26 may include digital and/or analog systems. The system may have components such as a processor, storage media, memory, input, output, communications link (wired, wireless, optical or other), user interfaces (e.g., a display or printer), software programs, signal processors (digital or analog) and other such components (such as resistors, capacitors, inductors and others) to provide for operation and analyses of the apparatus and methods disclosed herein in any of several manners well-appreciated in the art. It is considered that these teachings may be, but need not be, implemented in conjunction with a set of computer executable instructions stored on a non-transitory computer readable medium, including memory (ROMs, RAMs), optical (CD-ROMs), or magnetic (disks, hard drives), or any other type that when executed causes a computer to implement the method of the present invention. These instructions may provide for equipment operation, control, data collection and analysis and other functions deemed relevant by a system designer, owner, user or other such personnel, in addition to the functions described in this disclosure.

Set forth below are some embodiments of the foregoing disclosure:

Embodiment 1: A method for fabricating a piezoelectric transducer, the method including depositing a layer of a piezoelectric material on a base using a depositor, and applying an electric field to the layer of deposited piezoelectric material in defined locations using an electrode to sinter and pole the deposited piezoelectric material at those defined locations to form a layer of the piezoelectric transducer in a selected shape and with a selected dipole direction.

Embodiment 2: The method according to any prior embodiment, further including iterating the depositing and the applying to build up another layer of the piezoelectric material to provide the piezoelectric transducer having multiple layers of the piezoelectric material in a selected three-dimensional shape of the multiple layers.

Embodiment 3: The method according to any prior embodiment, further including depositing a layer of conductive material and applying the electric field wherein the defined locations to which the electric field is applied forms an electric lead, the piezoelectric transducer including multiple layers of the piezoelectric material and an electric lead.

Embodiment 4: The method according to any prior embodiment, further including securing the piezoelectric transducer in a housing or sub configured for being disposed in a borehole penetrating a subsurface formation, the housing or sub including a material compatible with a downhole environment.

Embodiment 5: The method according to any prior embodiment, wherein applying an electric field includes moving the electrode to a selected distance from the layer of a piezoelectric material such that a current of a selected value flows between the electrode and the base.

Embodiment 6: The method according to any prior embodiment, wherein applying an electric field includes applying the electric field in an atmosphere of an inert gas.

Embodiment 7: The method according to any prior embodiment, wherein depositing includes flowing the piezoelectric material in powder form from a reservoir to a spreader configured to move across the base.

Embodiment 8: The method according to any prior embodiment, wherein the layer of a piezoelectric material has a selected thickness.

Embodiment 9: The method according to any prior embodiment, wherein the electrode has a defined cross-sectional area to produce the sintering and poling over the defined cross-sectional area.

Embodiment 10: An apparatus for fabricating a piezoelectric transducer, the apparatus including a base, a piezoelectric powder depositor configured to deposit a layer of piezoelectric powder on the base, a gantry and boom assembly configured to move an end of the boom to a selected location with respect to the base, an electrode disposed at the end of the boom, a voltage source coupled to the electrode and base and configured to apply a voltage to the electrode with respect to the base to establish an electric field between the electrode and base with sufficient strength to sinter and pole the layer of piezoelectric material, and a controller coupled to the gantry and boom assembly and the voltage source and configured to control a position of the electrode and actuate the voltage source to the electrode to sinter and pole the layer of piezoelectric material at defined locations to form a layer of the piezoelectric transducer in a selected shape.

Embodiment 11: The apparatus according to any prior embodiment, further including at least one of a position sensor and a distanced sensor disposed on the gantry and boom assembly and coupled to the controller and configured to sense a position of the electrode and/or a distance from the electrode to the layer of piezoelectric material.

Embodiment 12: The apparatus according to any prior embodiment, further including a nozzle disposed on the gantry and boom assembly and coupled to an inert gas source, the nozzle being aimed to establish an inert gas environment in the electric field.

Embodiment 13: The apparatus according to any prior embodiment, wherein the electrode is coupled to a retractable telescopic boom in the gantry and boom assembly.

Embodiment 14: The apparatus according to any prior embodiment, wherein the piezoelectric powder depositor includes a reservoir configured to contain a reservoir of piezoelectric powder.

Embodiment 15: The apparatus according to any prior embodiment, wherein the piezoelectric powder depositor includes a spreader configured to traverse a surface of the base.

Embodiment 16: An acoustic transducer including a plurality of layers of a piezoelectric material disposed one layer upon another layer, the plurality of layers having a selected shape, thickness, and dipole direction.

Embodiment 17: The acoustic transducer according to any prior embodiment, wherein at least a portion of the plurality of layers form a curved surface.

Embodiment 18: The acoustic transducer according to any prior embodiment, wherein at least a portion of the plurality of layers includes a mechanical fastening component.

The term "carrier" as used herein means any device, device component, combination of devices, media and/or member that may be used to convey, house, support or otherwise facilitate the use of another device, device component, combination of devices, media and/or member. The logging tool 10 is one non-limiting example of a carrier. Other exemplary non-limiting carriers include drill strings of the coiled tube type, of the jointed pipe type and any combination or portion thereof. Other carrier examples include casing pipes, wirelines, wireline sondes, slickline sondes, drop shots, bottom-hole-assemblies, drill string inserts, modules, internal housings and substrate portions thereof.

Elements of the embodiments have been introduced with either the articles "a" or "an." The articles are intended to mean that there are one or more of the elements. The terms "including" and "having" and the like are intended to be inclusive such that there may be additional elements other than the elements listed. The conjunction "or" when used with a list of at least two terms is intended to mean any term or combination of terms. The term "configured" relates one or more structural limitations of a device that are required for the device to perform the function or operation for which the device is configured. The term "coupled" relates to being directly coupled or indirectly coupled using an intermediate component.

The flow diagram depicted herein is just an example. There may be many variations to this diagram or the steps (or operations) described therein without departing from the scope of the invention. For example, operations may be performed in another order or other operations may be performed at certain points without changing the specific disclosed sequence of operations with respect to each other. All of these variations are considered a part of the claimed invention.

The disclosure illustratively disclosed herein may be practiced in the absence of any element which is not specifically disclosed herein.

While one or more embodiments have been shown and described, modifications and substitutions may be made thereto without departing from the scope of the invention. Accordingly, it is to be understood that the present invention has been described by way of illustrations and not limitation.

It will be recognized that the various components or technologies may provide certain necessary or beneficial functionality or features. Accordingly, these functions and features as may be needed in support of the appended claims and variations thereof, are recognized as being inherently included as a part of the teachings herein and a part of the invention disclosed.

While the invention has been described with reference to exemplary embodiments, it will be understood that various changes may be made and equivalents may be substituted for elements thereof without departing from the scope of the invention. In addition, many modifications will be appreciated to adapt a particular instrument, situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. An apparatus for fabricating a piezoelectric transducer, the apparatus comprising:
    a base comprising a conductive material that is grounded;
    a piezoelectric powder depositor moveable in response to a motive force to traverse the base and configured to deposit a plurality of layers of piezoelectric powder on the base, the piezoelectric powder depositor comprising a spreader that traverses a surface of the base with the piezoelectric powder depositor, the spreader having an opening through which the piezoelectric powder is deposited on the base to deposit the plurality of layers of piezoelectric powder on the base;
    a gantry and boom assembly comprising an actuator configured to move an end of the boom to a selected location with respect to the base;
    an electrode disposed at the end of the boom;
    a voltage source coupled to the electrode and base and configured to apply a voltage to the electrode with respect to the base to establish an electric field between the electrode and base with sufficient strength to sinter and pole each layer of piezoelectric material after each layer is deposited; and
    a controller in communication with the gantry and boom assembly and the voltage source and with the piezoelectric powder depositor, the controller comprising a non-transitory medium having instructions to deposit the plurality of layers of the piezoelectric powder on the base and to control a position of the electrode and actuate the voltage source to the electrode to sinter and pole the layer of piezoelectric material at defined locations after each layer is deposited to form the piezoelectric transducer in a selected shape.

2. The apparatus according to claim 1, further comprising at least one of a position sensor configured to sense a position of the electrode and a distance sensor configured to sense a distance from the electrode to each deposited-layer of piezoelectric material, wherein the sensor or sensors are disposed on the gantry and boom assembly.

3. The apparatus according to claim 1, further comprising a nozzle disposed on the gantry and boom assembly and coupled to an inert gas source, the nozzle being configured to establish an inert gas environment in the electric field.

4. The apparatus according to claim 1, wherein the boom in the gantry and boom assembly is a retractable telescopic boom and the electrode is coupled to the retractable telescopic boom.

5. The apparatus according to claim 1, wherein the piezoelectric powder depositor comprises a reservoir configured to contain a supply of piezoelectric powder.

6. The apparatus according to claim 1, wherein the opening of the spreader is adjustable.

* * * * *